United States Patent [19]

Lindgren

[11] Patent Number: 4,975,311

[45] Date of Patent: Dec. 4, 1990

[54] VACUUM LAMINATION STATION

[75] Inventor: Kenneth S. Lindgren, Closter, N.J.

[73] Assignee: ITT Corporation, New York, N.Y.

[21] Appl. No.: 287,809

[22] Filed: Dec. 20, 1988

[51] Int. Cl.$^5$ .................. B32B 3/00; C23C 14/00
[52] U.S. Cl. ..................... 428/156; 428/167;
428/168; 428/172; 428/323; 428/146; 428/492;
428/408; 428/409; 428/901; 428/447; 118/50;
425/405.1; 156/285
[58] Field of Search ............ 42/156, 167, 192, 172,
42/167, 178, 168, 194, 328, 330, 425.9, 492, 323,
446, 408, 447, 409, 901; 425/85, 405.1; 118/50

[56] References Cited

U.S. PATENT DOCUMENTS 4,290,838 9/1981 Reavill et al. .................. 156/289
4,610,908 9/1986 Reylek et al. .................. 428/168

Primary Examiner—Ellis P. Robinson
Assistant Examiner—Donald J. Loney
Attorney, Agent, or Firm—Arthur L. Plevy

[57] ABSTRACT

A sheet material for use as a vacuum bag in the vacuum laminating of printed circuit boards, to heat sinks. The material of the sheet is flexible and electrically conductive to both conform around electrical components and to prevent damage to the components due to electrostatic discharge. In addition, the material has one surface which is textured. The sheet material is formed into an enclosure to hold the circuit board and heat sink and it is the textured surface which is placed in contact with the "populated" surface of the board to permit air to be easily removed from the bag enclosure during the initial evacuation stage of the lamination process.

8 Claims, 4 Drawing Sheets

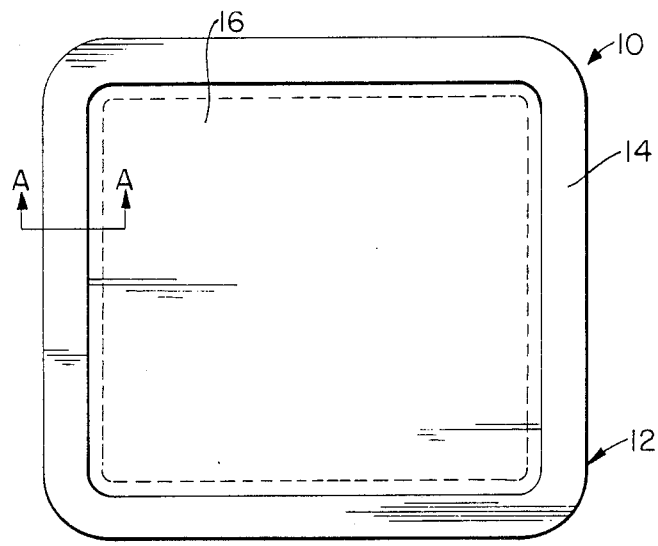
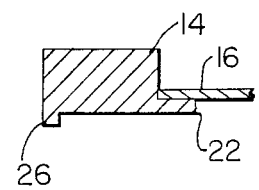
FIG. 1A
FIG. 1B
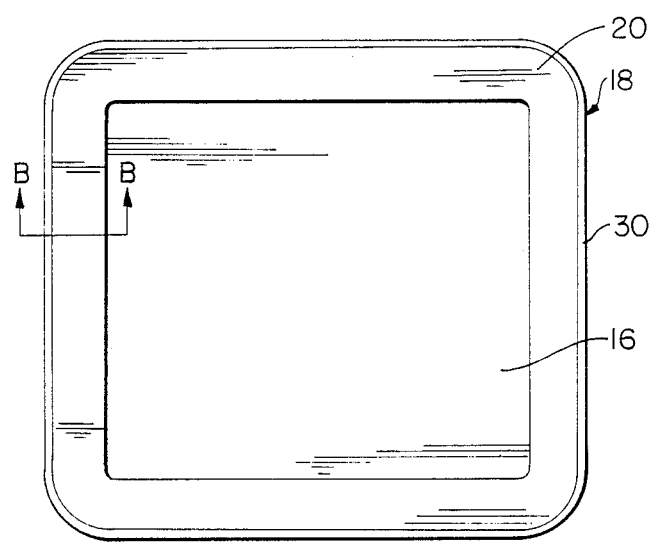
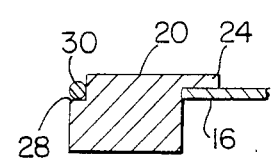
FIG. 2A
FIG. 2B

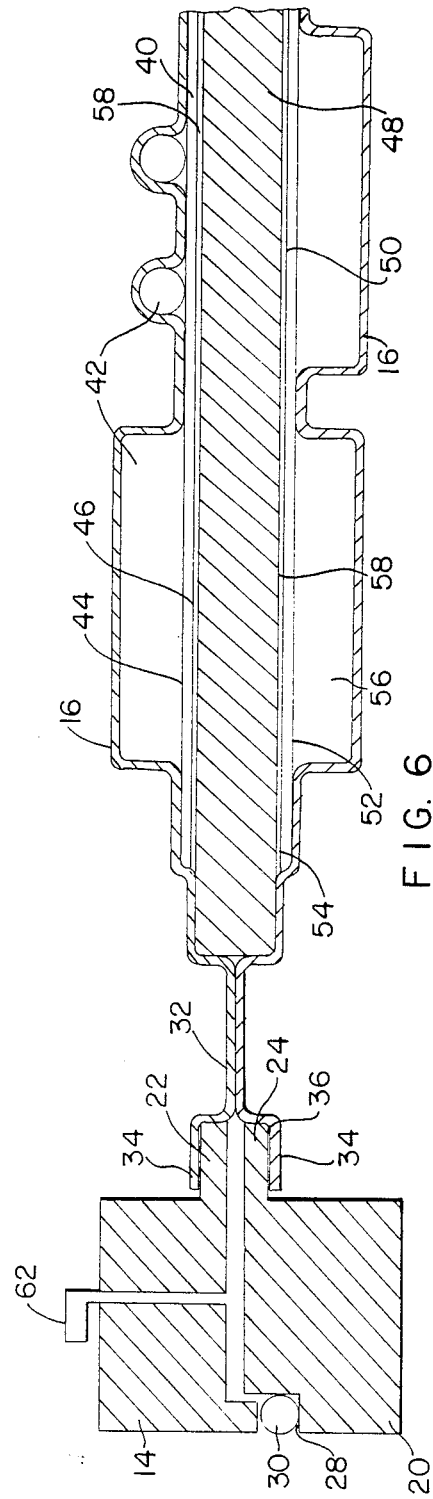

VACUUM LAMINATION STATION

BACKGROUND OF THE INVENTION

This invention relates to a vacuum lamination station and more particularly to a vacuum bag lamination material and a method for using such a material for the vacuum lamination of printed circuit boards to a heat sink.

Vacuum lamination is known in the art. Processes employing vacuum bags are presently being used to laminate many items from skis to advanced composite aircraft wings. Vacuum lamination is a method of applying a uniform pressure over a flat or curved object which may be difficult or impossible to achieve using rigid presses.

In the manufacturing of certain printed circuit board (PCB) assemblies, a single sided surface mount PCB is bonded to a heat dissipation element or heat sink using a heat curable adhesive. This bonding process is usually done in a heated press. The heated press provides both the heat required to cure the adhesive and the pressure required for intimate contact of the PCB and the heat sink at the bond line. A PCB with electrical components attached to it is called a populated PCB and the side of the PCB where electrical components are placed is known as the component side. In the past only unpopulated circuit boards could be bonded to heat sinks because the heated press would crush any components on the PCB. The required testing of a circuit board for component polarity and for electrical shorts or opens between component leads and the pads that they are soldered to can only be done on populated circuit boards. This testing is greatly facilitated if nodes on the bottom (heat sink side) of the circuit board can be accessed by test equipment probes. If the circuit board is laminated to a heat sink, these nodes are inaccessible and the testing is difficult and time consuming. Since the components could not be mounted on the board prior to lamination, it was extremely difficult to test the circuit board after lamination. In some instances, an irreparable fault was found during testing and, since the bad board could not be removed from the heat sink, the whole assembly would have to be scrapped.

By using a vacuum lamination system, curing of adhesives may be carried out on populated PCB assemblies which, due to the presence of electrical components, have irregular surfaces. In this method, after the adhesive is applied between the circuit board and heat sink, the unit is placed in a bag, and a vacuum is established inside the bag. The pressure differential between the inside and outside of the bag maintains the required contact pressure between the board and heat sink during an adhesive heat-curing operation.

However, the commercially available bag materials used for vacuum lamination are made of plastic films. One disadvantage of these films is that they are very inelastic. In this regard they are best suited for applications involving smooth, gradual contours because the inelasticity of the material causes severe "tenting" around abrupt surface features such as electrical components. Tenting creates an uneven pressure distribution which is unacceptable for laminating populated printed circuit boards to heat sinks.

Another disadvantage of plastic film bags is that they become stiff and brittle after the heat curing process which can result in tearing of the bags. They are thus best suited to one-time-use situations.

Some vacuum lamination methods have employed silicon rubber sheets as the vacuum bag material. However, both the plastic films and the silicon rubber sheets have smooth surfaces which will seal against each other around the periphery of the PCB assembly and prevent the vacuum from spreading throughout the bag. This prevents the even pressure distribution required for proper lamination. In typical vacuum lamination processes, a breather cloth is usually placed between the unit to be laminated and the inside surface of the bag to provide a pathway for air to escape during air evacuation. But, the breather cloth increases the tenting problem and can become enmeshed in and bonded to any adhesive that flows from the bond line.

An additional problem with vacuum bags made of either plastic or silicon rubber is that the bag materials build up static charges as the inside surfaces press against each other during air evacuation. These charges can be greater than 10,000 volts. Since many electronic components are highly sensitive to electrostatic discharge (ESD) and can be damaged by charges as low as 50 volts, many of the components on the PCB would be destroyed. Antistatic materials and treatments were found to be ineffective when subjected to the lamination process.

It is therefore an object of the present invention to provide a lamination material which overcomes the disadvantages of the prior art.

It is an additional object of the present invention to provide a lamination material which is easy to use and cost effective.

It is yet another object to provide a method of vacuum laminating populated printed circuit boards to heat sinks.

These objects and others which will become apparent hereinafter are accomplished by the present invention which provides a sheet material for use in a process for laminating an article. The sheet material includes an elastic material substance, an electrically conductive material incorporated into said elastic material, and means located on a surface of the elastic sheet for permitting air to traverse the surface when the sheet is in contact with a smooth surface.

The present invention also provides a method of laminating a printed circuit board including providing a printed circuit board having two opposed surfaces, positioning an electronic component on one surface of the board, applying an adhesive to the other surface of the board, positioning a heat sink adjacent the adhesive; placing a sheet of flexible, electrically conductive material surrounding the board and heat sink to form an enclosure, the sheet having means located on an area thereof such that air is permitted to move along the area when the sheet is in contact with the one surface of the board; establishing a vacuum in the enclosure; curing the adhesive to form a laminated assembly; and removing the laminated assembly from the vacuum enclosure.

BRIEF DESCRIPTION OF THE DRAWING

The above-mentioned and other features and objects of this invention will become more apparent by reference to the following description taken in conjunction with the accompanying drawing in which:

FIGS. 1A and 1B are views of the top of the vacuum frame of the present invention;

FIGS. 2A and 2B are views of the bottom of the vacuum frame of the present invention;

FIGS. 5A-5B are cross-sectional views of texture profiles;

FIG. 6 is a cross-sectional view of the vacuum bag assembly of the invention.

DETAILED DESCRIPTION OF THE INVENTION

Figure 3:
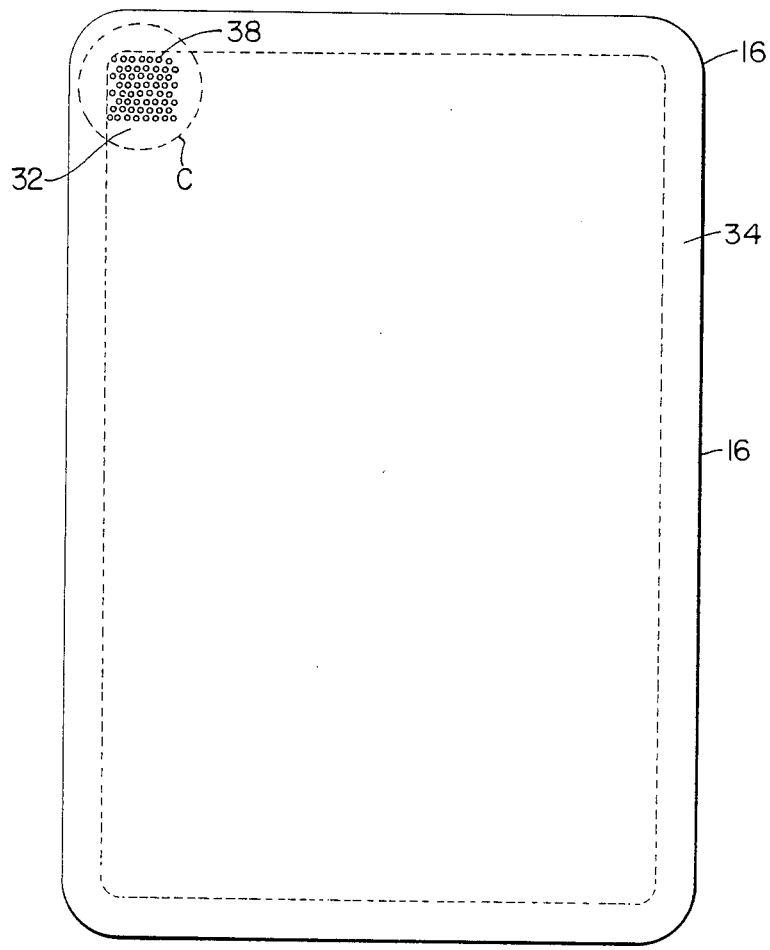
FIG. 3 is a view of the textured surface of the vacuum laminate material.

In FIG. 1A there is shown a top view of the top half 12 of a vacuum frame assembly 10. The top half 12 has a frame section 14 and a sheet of a vacuum laminating material 16 mounted in the frame section 14. FIG. 1B is a cross-sectional view of the frame section 14 taken through the line A—A of FIG. 1A.

FIG. 2A shows a top view of the bottom half 18 of the vacuum frame assembly 10. The bottom half 18 has a frame section 20 and a sheet of the vacuum laminating material 16 mounted therein. FIG. 2B is a cross-sectional view of the frame section 20 taken through the line B—B of FIG. 2A.

A sheet mounting flange 22 extends along the inner periphery of the frame section 14 and a corresponding sheet mounting flange 24 extends along the inner periphery of the frame section 20. The flanges 22, 24 are positioned near the middle of the inner periphery of the frame assembly 10 to allow clearance for the PCB when the loaded frame is placed flat on a surface.

A sealing lip 26 extends along the lower outer periphery of the top half frame section 14. A recess 28 extends along the upper peripheral portion of the bottom half frame section 20. The recess 28 has an O-ring 30 mounted thereon.

When the top half 12 and bottom half 18 are joined together, the sealing lip 26 fits into the recess 28. This allows quick and positive alignment of the two frames, and the O-ring 30 is sandwiched therebetween to form a tight seal during the vacuum stage.

Reference will now be made to FIG. 3. The sheet 16 has a textured area 32 including raised portions 38. The raised portions 38 extend a distance of approximately 0.015 inches from the surface of the sheet although any distance which permits air movement is acceptable. The textured area covers a major portion of the sheet surface and extends within the region defined by the dotted lines as shown in FIG. 3. However, the texturing is shown only in encircled Detail C. By texturing the surface of the sheet which faces the component side of the PCB to be vacuum laminated, air does not become trapped around the board, thus allowing the vacuum to access the entire surface of the board which is required for successful lamination.

A border region 34 extends along the outer periphery of the sheet 16 and is not textured. This region 34 is affixed to the flange of the frame section. With respect to the top frame section 14, the sheet is affixed to the flange 22. In the case of the bottom frame section 20, the sheet is affixed to the flange 24.

A preferred material for the sheet was found to be a mixture of silicon rubber and carbon. Silicon rubber has excellent elasticity and durability, and the addition of carbon gives the silicon rubber electrically conductive properties.

Silicon rubber is an extremely elastic substance. It maintains its elasticity at temperatures up to 450° C. It can withstand repeated use at elevated temperatures. It conforms itself to the shape of components against which it is pressed without damage to either the component or itself.

Since the electronic components mounted on the PCBs are particularly sensitive to ESD, it was found that adding a material to the silicon rubber which would conduct electrical charges to ground would preserve the components. Several materials exhibit good conductivity characteristics. It was found that carbon added to the silicon rubber material would perform reliably since it has a minimal effect on the elasticity of the silicon rubber.

The sheet 16 is preferably formed by first extruding a thin sheet of the combined silicon rubber/carbon material. The extruded material is then molded and cured to obtain the finished product. The texture pattern is built into the mold. A thickness of 20-30 mils is satisfactory to produce a sheet which is durable and elastic. Thicknesses greater than 20-20 mils are acceptable as long as the elastic properties of the material are maintained in order to avoid tenting.

The material of the sheet 16, in a preferred form, exhibits the characteristics shown in Table A.

TABLE A

| ASTM Test Method | Property | Typical Value |
|---|---|---|
| D-2240 | Durometer | 55 Shore A |
| D-412 | Tensile Strength | 550 psi |
| D-412 | Elongation | 250% |
| D-624 | Tear Resistance (Die B) | 60 ppi |
| — | Volume resistivity | 50 ohm/cm |

The attachment of the sheet to the flange is accomplished by applying a nickel filled silicon rubber, room temperature vulcanizing (RTV) adhesive 36 to the region 34 (shown in FIG. 6). the adhesive is electrically conductive. The sheet is then mounted to the flange and the adhesive cured.

Figure 4:
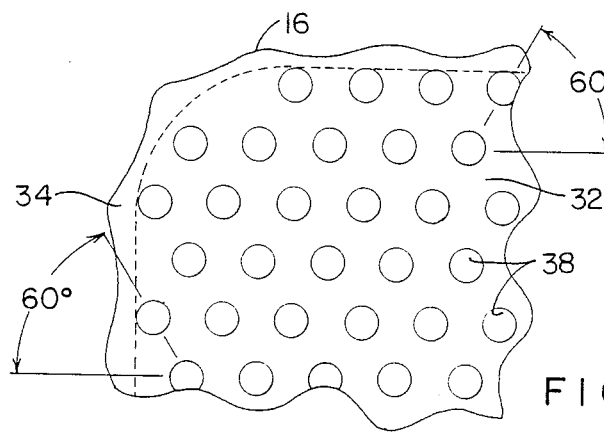
FIG. 4 is an enlarged view of Detail C of FIG. 3.

An enlarged view of Detail C of FIG. 3 is shown in FIG. 4. As illustrated, a preferred arrangement for the texture pattern is where the raised portions 38 extend along a line 60° from normal. By means of this arrangement, each of the raised portions is equidistant from adjacent raised portions to aid in air evacuation.

The texturing eliminates the need for a separate breather cloth and permits even pressure distribution between the board and heat sink resulting in a good bond line.

FIGS. 5A and 5B illustrate possible profiles of raised portions 38 which would be effective against formation of air pockets. The invention is not restricted to the profiles illustrated. Raised portions 38 may take any of a variety of forms and may be chosen based upon ease of manufacture, as long as the profile allows air to pass along the sheet when the sheet is pressed against another surface.

The electrically conductive, durably elastic, textured material, used in place of standard vacuum bag materials, gave excellent results in performing vacuum lamination of printed circuit boards on which the electronic components had already been mounted and tested. By using this material the need for a separate breather cloth is eliminated because the air is free to flow across the surface of the material during air evacuation due to the surface texturing of the material. In addition, because the material is electrically conductive, any electric charges that arise are dissipated to ground. Thus ESD damage to the sensitive electronic components mounted on the boards is eliminated.

FIG. 6 illustrates the arrangement of the vacuum frame assembly for the vacuum lamination process. The printed circuit board 40 has two opposed surfaces 44, 46. The surface 44 has electronic components 42 mounted thereon. A second printed circuit board 50 also has two opposed surfaces 52, 54. The surface 52 has electronic components 56 mounted thereon. A heat sink 48 is positioned between the circuit board surfaces 46, 54 and an adhesive 58 is placed between the surfaces 46 and 54 and the heat sink 48. Any adhesive suitable for joining PCBs to heat sinks may be used. One type of adhesive is a composite strip of epoxy adhesive/"KAPTON"/epoxy adhesive/aluminum/epoxy adhesive which is placed with the aluminum/epoxy surface adjacent the heat sink. "KAPTON" is a thin sheet, high temperature polyimide plastic material.

The top frame section 14 fits on the bottom frame section 20 with the O-ring 30 positioned in the recess 28. A vacuum fitting 62 extends through the top half frame section 14. The vacuum access fitting 62 may be placed anywhere on the top frame section 14. A preferred method for connecting the vacuum access fitting 62 to the top half frame section 14 is with a straight thread gasket seal boss, such as, for example, Military Specification No. MS-16142. This connection port provides easy removal of the vacuum access hardware. Furthermore it makes a positive seal and minimizes the distortion that can be induced in the frame by welded, brazed or pipe threaded fittings.

The borders 34 of the vacuum laminating material sheets 16 are secured to the frame assembly at flanges 22, 24 by the conductive adhesive 36. The sheet is shown after the air evacuation stage.

Figure 7:
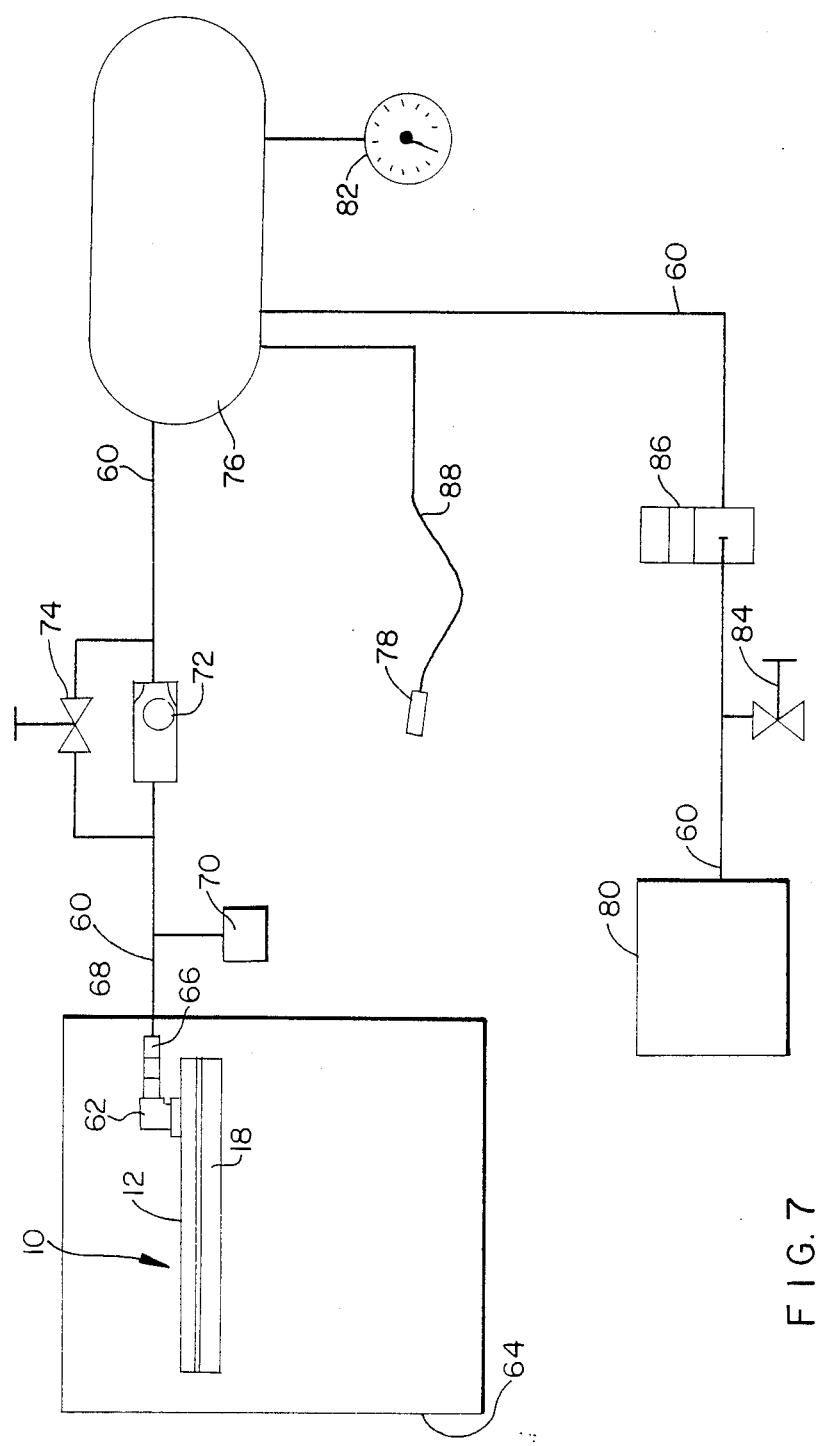
FIG. 7 is a diagrammatic representation of the vacuum system of the invention.

FIG. 7 is a schematic diagram of the vacuum system to which reference will now be made. An oven 64 is used to perform the curing of the adhesive. The oven is a mechanical convection type oven which insures even heat distribution throughout the chamber. A conductive vacuum line 60 is joined at one end to a self-sealing vacuum port 66 situated inside the oven 64 and at the other end to a vacuum pump 80. The line 60 exits the oven through a vent hole 68 in the oven wall. A vacuum sensor 70 is connected to the vacuum line 60 beyond the oven 64. The sensor 70 monitors the level of the vacuum in the line 60.

The line 60 beyond the vacuum sensor 70 is joined to a modified ball check valve 72 which functions as a safety shut off to protect the vacuum system if one of the sheets should rupture. The ball check valve has been modified by removing the spring. Thus, when the valve is in a horizontal position, the ball rests on an interior wall of the valve and away from the seat. This permits a slow air flow through the check valve 72. If a rupture should occur in the assembly 10, air from the interior of the oven will enter the conductive line 60 through the rupture. As the air rushes through the check valve 72, it throws the ball against the seat, holding the ball in that position until the pressure differential is relieved by a bypass valve 74 which is joined to the line 60 at points just before and just after the check valve 72. The bypass valve is preferably manually controlled. The vacuum sensor 70 controls an electrical switch which controls a warning light and alarm which will indicate a problem in the vacuum level.

An accumulation tank 76 communicates with the line 60 between the check valve 72 and the vacuum pump 80. The tank 76 handles high air inrushes during initial evacuation of the assembly 10. In addition, if the vacuum pump should shut down, the tank will help maintain the current vacuum level in the assembly 10. A vacuum gage 82 indicates the vacuum level in the tank 76.

An auxiliary vacuum port 78 is connected to the accumulation tank 76 by a flexible tubing 88. The tubing 88 need not be electrically conductive for reasons that will be explained hereinbelow.

A normally closed solenoid valve 86 is connected to the vacuum line 60 between the accumulation tank 76 and the vacuum pump 80. The valve 86 will prevent vacuum loss through the vacuum pump 80 in the event of a system shut down.

Connected to the vacuum line between the vacuum pump 80 and the solenoid valve 86 is a regulating valve 84 which opens to the atmosphere. The valve 84 is operated in conjunction with the pump 80. By controlling the amount of air which enters the vacuum line through the regulating valve 84, the vacuum level in the line can be varied from zero inches of mercury, when the valve is full open, to the maximum vacuum capacity of the pump when the valve is closed. Since the optimum vacuum level for lamination is less than the capacity of the vacuum pump 80, this allows the pump to operate at less than maximum capacity, thus prolonging the life of the pump.

More than one vacuum frame assembly may be placed in the oven at one time. The system described herein handles six vacuum frame assemblies at one time, but the capacity of the system can be easily increased. Where more than one vacuum frame assembly is placed in the oven at one time, each assembly is joined to a separate vacuum line, vacuum sensor and safety shut off valve system. Each of the vacuum lines is connected to the accumulation tank 76. From the accumulation tank 76 to the vacuum pump 80, a single vacuum line is used.

The vacuum laminating operation will now be explained.

The PCB-heat sink unit is placed between the top and bottom halves 12 and 18, respectively, of the vacuum frame assembly. The two halves are placed into engagement with each other, with the textured surfaces of the sheets 16 facing each other. The O-ring 30 is sandwiched between the frame halves.

After the top and bottom halves 12 and 18 are joined together to form the assembly 10, the auxiliary vacuum port 78 is connected to the vacuum access fitting 62. The assembly 10 is then placed on a grounded conductive surface and initial evacuation of the assembly is performed. Any electrical charges generated will be conducted from the sheets 16 through the conductive adhesive 36 to the frame sections 14, 20 to the grounded conductive surface. The evacuated air leaves the frame halves through the vacuum access fitting 62 and enters the flexible tubing 88. From the tubing 88 the evacuated air enters the tank 76. As stated above, the tubing 88 need not be electrically conductive as long as the assembly is grounded during air evacuation.

As evacuation of the air in the area between the frames proceeds, the pressure differential between the inside and the outside of the frame assembly increases and the net force holding the frame halves together against the O-ring increases. When no vacuum is present between the frame halves, the pressure differential is zero, and the frames will separate easily.

The evacuation continues until the optimum pressure for the adhesive being used has been reached. The pressure can be varied from a minimum of 3 psi which corresponds to a vacuum of approximately six (6) inches of mercury to a maximum of approximately 13.5 psi which corresponds to a vacuum of 27 inches of mercury. Higher pressures are within the scope of the invention. A pressure of 5 psi has been found to produce good lamination results when using a low flow epoxy adhesive.

When the predetermined optimum pressure level has been reached, the auxiliary vacuum port 78 is disconnected from the vacuum access port 62 and the assembly 10 is placed in the oven 64. In the oven, the port 62 is joined to the quick release, self-sealing vacuum port 66 which permits quick installation of the assembly in the oven 64 without loss of vacuum. The pressure in the assembly is maintained at the predetermined optimum level during the oven curing process.

In order to eliminate any further possibility of accumulating electrical charges on the PCBs which result from the evacuation process, in addition to the conductive surface upon which the frames are placed during initial evacuation, the vacuum delivery system itself is grounded. Once in the oven, electrical charges are conducted by the sheets 16 through the conductive adhesive 36 to the frame sections 14 and 20 and then to the vacuum access fitting 62. From the fitting 62 they are conducted to the vacuum port 66 and then to the conductive vacuum line 60 and from there to the vacuum delivery system. A conductive (not shown) lead may also be used to join the vacuum line to the grounded oven during the adhesive curing operation.

The adhesive is heated to a temperature and for a length of time required to completely cure the adhesive. For the low flow epoxy adhesive used, maintaining a temperature in the range of 125° C. for two (2) hours is sufficient to cure the adhesive. The temperature of 125° C. is the maximum storage temperature of the electronic components and curing at temperatures above that point may degrade the performance of the components.

Although these parameters are preferred, the pressure/time temperature relationship may be altered and still achieve a good lamination.

After the assembly is removed from the oven, the pressure on the frame is released and the laminated circuit boards removed.

The pretested laminated boards are now ready for further processing without the need for additional testing of the mounted components.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A sheet material for use in a vacuum lamination process for laminating an article, comprising:
   a thin sheet made of an elastic material substance having a given surface area on opposite sides thereof;
   an electrically conductive material incorporated into said elastic material substance throughout the sheet so as to provide an electrically conductive property to said sheet over the surface area thereof; and
   a plurality of raised projections spaced apart from each other and distributed over the surface area of a side of the sheet and located on a side of the sheet for permitting air to traverse the sheet when the side is in contact with a smooth surface.

2. The sheet material of claim 1 wherein said elastic material substance is silicon rubber.

3. The sheet material of claim 1 wherein said electrically conductive material is carbon.

4. The sheet material of claim 3 wherein the resistivity of the conductive material is in the range of 50 ohms per centimeter.

5. The sheet material of claim 1 wherein said projections are equidistantly spaced and uniformly distributed in a textured pattern over the surface area of said side of the sheet and extending from said side by a distance of about 0.015 inches.

6. The sheet material of claim 4 wherein said projections are molded on the side of the sheet.

7. In an apparatus including a vacuum frame assembly for use in a vacuum lamination process for laminating an article, the improvement of a sheet material, which is held by the vaccum frame assembly, comprising:
   a thin sheet made of an elastic material substance having a given surface area on opposite sides thereof;
   an electrically conductive material incorporated into said elastic material substance through the sheet so as to provide an electrically conductive property to said sheet over the surface area thereof; and
   a plurality of raised projections spaced apart from each other and distributed over the surface area of a side of the sheet and located on a side of the sheet for permitting air to traverse the sheet when the side is in contact with a smooth surface.

8. The sheet material of claim 7 wherein said projections are equidistantly spaced and uniformly distributed in a textured pattern over the surface area of said side of the sheet and extending from said side by a distance of about 0.015 inches.

* * * * *